(12) United States Patent
Kim et al.

(10) Patent No.: US 10,886,357 B2
(45) Date of Patent: *Jan. 5, 2021

(54) CIRCUIT FOR PREVENTING STATIC ELECTRICITY AND DISPLAY DEVICE HAVING THE SAME

(71) Applicant: SAMSUNG DISPLAY CO., LTD., Yongin-si (KR)

(72) Inventors: Yong-Jae Kim, Yongin-si (KR); Bo-Yong Chung, Yongin-Si (KR); Hae-Yeon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/665,958

(22) Filed: Oct. 28, 2019

(65) Prior Publication Data

US 2020/0066823 A1    Feb. 27, 2020

Related U.S. Application Data

(63) Continuation of application No. 16/233,065, filed on Dec. 26, 2018, now Pat. No. 10,461,144, which is a
(Continued)

(30) Foreign Application Priority Data

Jan. 28, 2013 (KR) .......................... 10-2013-0009434

(51) Int. Cl.
*H01L 27/32* (2006.01)
*H01L 27/12* (2006.01)
(Continued)

(52) U.S. Cl.
CPC .... *H01L 27/3276* (2013.01); *G02F 1/136204* (2013.01); *G09G 3/3208* (2013.01);
(Continued)

(58) Field of Classification Search
CPC ............. H01L 27/3262; H01L 27/3276; H01L 27/3265; H01L 27/1214; H01L 29/4232;
(Continued)

(56) References Cited

U.S. PATENT DOCUMENTS

| 4,072,976 | A | * | 2/1978 | Harari | ..................... H01L 29/78 257/356 |
| 5,345,357 | A | * | 9/1994 | Pianka | ................ H01L 27/0266 361/56 |

(Continued)

FOREIGN PATENT DOCUMENTS

| CN | 101859764 A | 10/2010 |
| CN | 102801902 A | 11/2012 |

(Continued)

OTHER PUBLICATIONS

Extended European Search Report dated Apr. 11, 2014 for European Application No. EP 14150424.1, 9 pgs.
(Continued)

*Primary Examiner* — Andrew Sasinowski
(74) *Attorney, Agent, or Firm* — Lewis Roca Rothgerber Christie LLP

(57) ABSTRACT

A static electricity prevention circuit of a display device including: a driving circuit configured to drive a display unit that displays an image, at least one clock signal wire configured to transmit a clock signal to the driving circuit, at least one transistor electrically coupled to the clock signal wire, and at least one capacitor including a first electrode coupled to a source electrode and to a drain electrode of the transistor, and a second electrode configured to be maintained at a voltage.

9 Claims, 3 Drawing Sheets

Related U.S. Application Data continuation of application No. 16/036,847, filed on Jul. 16, 2018, now Pat. No. 10,199,450, which is a continuation of application No. 14/708,116, filed on May 8, 2015, now Pat. No. 10,026,798, which is a continuation of application No. 13/957,371, filed on Aug. 1, 2013, now Pat. No. 9,058,770.

(51) Int. Cl.

| | | |
|---|---|---|
| *G02F 1/1362* | (2006.01) | |
| *H01L 29/423* | (2006.01) | |
| *H01L 27/02* | (2006.01) | |
| *H01L 23/60* | (2006.01) | |
| *G09G 3/3208* | (2016.01) | |

(52) U.S. Cl.
CPC ............ *H01L 23/60* (2013.01); *H01L 27/027* (2013.01); *H01L 27/0266* (2013.01); *H01L 27/0296* (2013.01); *H01L 27/1214* (2013.01); *H01L 27/3262* (2013.01); *H01L 27/3265* (2013.01); *H01L 29/4232* (2013.01); *G02F 2202/22* (2013.01); *G09G 2330/04* (2013.01); *H01L 2924/0002* (2013.01)

(58) Field of Classification Search
CPC ............... H01L 27/0266; H01L 27/027; H01L 27/0296; H01L 23/60; H01L 2924/0002; H01L 27/0248; G09G 3/3208; G09G 2330/04; G09G 3/20; G02F 1/136204; G02F 2202/22

See application file for complete search history.

(56) References Cited

U.S. PATENT DOCUMENTS

| | | | |
|---|---|---|---|
| 6,515,644 B1 | 2/2003 | Kim | |
| 7,164,230 B2 | 1/2007 | Park | |
| 7,262,753 B2 | 8/2007 | Tanghe et al. | |
| 8,120,031 B2 | 2/2012 | Yamazaki et al. | |
| 8,168,975 B2 * | 5/2012 | Koyama | G02F 1/13454 257/192 |
| 8,174,476 B2 * | 5/2012 | Jo | G09G 3/20 257/298 |
| 8,264,426 B2 | 9/2012 | Chung | |
| 8,902,137 B2 | 12/2014 | Koyama | |
| 10,461,144 B2 * | 10/2019 | Kim | H01L 27/1214 |
| 2005/0287750 A1 | 12/2005 | Lee | |
| 2006/0050451 A1 | 3/2006 | Jen-Chou | |
| 2007/0195018 A1 | 8/2007 | Chiou et al. | |
| 2007/0273621 A1 | 11/2007 | Yamashita et al. | |
| 2007/0296652 A1 | 12/2007 | Imamura et al. | |
| 2008/0030495 A1 | 2/2008 | Shirasaki et al. | |
| 2008/0042945 A1 | 2/2008 | Mutsukura et al. | |
| 2008/0042948 A1 | 2/2008 | Yamashita et al. | |
| 2008/0049053 A1 | 2/2008 | Asano et al. | |
| 2010/0073009 A1 | 3/2010 | Wang et al. | |
| 2010/0156692 A1 | 6/2010 | Jeon et al. | |
| 2011/0031496 A1 | 2/2011 | Yamazaki et al. | |
| 2011/0031497 A1 | 2/2011 | Yamazaki et al. | |
| 2011/0134104 A1 | 6/2011 | Yoon et al. | |
| 2011/0210324 A1 | 9/2011 | Sakakura et al. | |
| 2012/0182654 A1 | 7/2012 | Wang et al. | |

FOREIGN PATENT DOCUMENTS

| | | |
|---|---|---|
| DE | 3929161 A1 | 3/1991 |
| EP | 0605176 A1 | 12/1993 |
| JP | 11-194368 A | 7/1999 |
| JP | 2001-339051 A | 12/2001 |
| JP | 2006-18165 A | 1/2006 |
| JP | 2008-211223 A | 9/2008 |
| JP | 2010-97024 A | 4/2010 |
| JP | 2011-54936 A | 3/2011 |
| KR | 0135499 B1 | 1/1998 |
| KR | 10-0299686 B1 | 10/2001 |
| KR | 10-0839750 B1 | 6/2008 |
| KR | 10-2011-0115746 A | 10/2011 |
| KR | 10-2011-0119573 A | 11/2011 |
| KR | 10-2012-0067733 A | 6/2012 |
| TW | 200733796 | 9/2007 |

OTHER PUBLICATIONS

Mohan et al. . "ESD Protection Design Methodology in Deep Sub-micron CMOS Technologies." *CiteSeerX—Similarity Options:.* University of Waterloo Department of Electrical and Computer Engineering, Winter 2003. XP055111206. <http://citeseerx.ist.psu.edu/viewdoc/download?doi=10.1.1.115.6820&rep=rep1&type=pdf>.

Yuan, Fei. "Electrostatic Discharge Protection." *ELE863/EE8501 VLSI Systems*. Ryerson University Department of Electrical & Computer Engineering. 2012. XP055111209. <http://www.ee.ryerson.ca/~fyuan/esd.pdf>.

TIPO Office Action dated Dec. 5, 2016, for corresponding Taiwanese Patent Application No. 102137579 (5 pages).

\* cited by examiner

CIRCUIT FOR PREVENTING STATIC ELECTRICITY AND DISPLAY DEVICE HAVING THE SAME

CROSS-REFERENCE TO RELATED APPLICATION

This application is a continuation of U.S. application Ser. No. 16/233,065, filed Dec. 26, 2018, which is a continuation of U.S. patent application Ser. No. 16/036,847, filed Jul. 16, 2018, now U.S. Pat. No. 10,199,450, which is a continuation of U.S. patent application Ser. No. 14/708,116, filed May 8, 2015, now U.S. Pat. No. 10,026,798, which is a continuation of U.S. patent application Ser. No. 13/957,371, filed Aug. 1, 2013, now U.S. Pat. No. 9,058,770, which claims priority to and the benefit of Korean Patent Application No. 10-2013-0009434, filed Jan. 28, 2013, the entire content of both of which is incorporated herein by reference.

BACKGROUND

(a) Field

Embodiments of the present invention relate to a static electricity prevention circuit and a display device including the same.

(b) Description of the Related Art

In general, a flat display device such as an organic light emitting diode (OLED) display has several advantages, as compared to a cathode ray tube display, such as a decrease in size, thickness, and power consumption, and is capable of realizing images of full-color and high resolution. These advantages have led to flat display devices being widely applied in various fields. Currently, the OLED display device has been used in computers, laptops, phones, TVs, audio/video devices, and the like.

Such an OLED display displays an image by controlling the amount of driving current transmitted to an organic light emitting element according to an image data signal applied to each of a plurality of pixels arranged in a matrix format.

Generally, a glass substrate is used as a substrate of the display device, but the glass substrate also acts as an insulator, so static electricity charges created during a panel manufacturing process collect on the glass substrate, thus causing foreign particles such as dusts to be easily attached to the glass substrate, thereby causing a process failure. Further, elements in the panel can be damaged due to the static electricity; therefore it is desirable for the collection of static electricity to be prevented in the flat display panel.

Conventionally, a wire or a resistor for shielding static electricity is inserted into an edge of the display panel. In addition, a static electricity prevention circuit using a diode is installed between a wire for supplying a power source voltage for driving the display panel and a wire for supplying a signal for a lighting test.

However, as the display size has increased, the occurrence of static charge has become more frequent during the manufacturing process and module assembling. Thus, the conventional art, such as the wire or the resistor for shielding static electricity, cannot effectively prevent static electricity from occurring in the large-sized display panel. In addition, when the static electricity prevention circuit is installed, damage caused by a short-circuit may frequently occur due to incidents such as a burst occurring in the static electricity prevention circuit as a result of high potential difference that is caused by the static electricity. Accordingly, driving of the display panel may fail.

Therefore, design of a display panel that is resistant to static electricity is used to prevent driving failure of the display panel, and to prevent damage to the display panel of the OLED display due to burst damage to the static electricity prevention circuit, and at the same time to effectively prevent occurrence of static electricity in the large-sized display panel.

The above information disclosed in this Background section is only for enhancement of understanding of the background of the invention, and therefore it may contain information that does not form the prior art that is already known in this country to a person of ordinary skill in the art.

SUMMARY

An example embodiment of the present invention may prevent inflow and occurrence of static electricity in a display panel to prevent malfunction and damage in the display panel, and to prevent manufacturing process failure of the display device due to the static electricity.

In addition, a static electricity prevention design circuit that can be effectively applied to a large-sized display panel can be provided to avoid driving failure due to the inflow of the static electricity in the display device, thereby providing a display panel having excellent quality.

According to one aspect of the present invention, there is provided a static electricity prevention circuit of a display device including: a driving circuit configured to drive a display unit that displays an image; at least one clock signal wire configured to transmit a clock signal to the driving circuit, at least one transistor electrically coupled to the clock signal wire; and at least one capacitor including a first electrode coupled to a source electrode and to a drain electrode of the transistor, and a second electrode configured to be maintained at a voltage.

The clock signal wire may be coupled with a gate electrode of the transistor through a gate metal wire.

The transistor may include: a semiconductor layer including an impurity-doped area doped with a semiconductor impurity, and an intrinsic semiconductor area not doped with any semiconductor impurity; a gate electrode layer on the semiconductor layer; and a gate insulation layer between the gate electrode layer and the semiconductor layer, wherein the gate insulation layer is configured to create an electrical open or an electrical short-circuit by a static electricity current flowing through the clock signal wire.

The impurity-doped area of the semiconductor layer may include: a first impurity-doped area; and a second impurity-doped area opposite to the first impurity-doped area and electrically coupled to a portion of the first impurity-doped area not overlapping the gate electrode layer.

The static electricity prevention circuit may further include a capacitor including a first electrode that is electrically coupled to the impurity-doped area of the semiconductor layer, the capacitor being configured to accumulate an inflow static electricity current when the gate insulation layer is short-circuited.

According to another aspect the present invention, there is provided a display device including: a display unit including a plurality of pixels configured to display an image by emitting light based on a data voltage corresponding to an image data signal; a driving circuit configured to drive the display unit; at least one clock signal wire configured to transmit a clock signal to the driving circuit; and a static electricity prevention circuit including: at least one transistor electrically coupled to the clock signal wire; and at least one capacitor including a first electrode coupled to both of a source electrode and a drain electrode of the transistor, and a second electrode configured to be applied with a fixed voltage.

The static electricity prevention circuit may be coupled between the clock signal wire and the driving circuit.

The clock signal wire may be coupled to a gate electrode of the transistor of the static electricity prevention circuit through a gate metal wire.

The transistor may include: a semiconductor layer including an impurity-doped area that is doped with a semiconductor impurity and is electrically coupled to the first electrode of the capacitor, and an intrinsic semiconductor layer that is not doped with any semiconductor impurity; a gate electrode layer on the semiconductor layer; and a gate insulation layer between the gate electrode layer and the semiconductor layer.

The impurity-doped area of the semiconductor may include: a first impurity-doped area; and a second impurity-doped area opposite to the first impurity-doped area and electrically coupled to a portion of the first doped-impurity area not overlapping the gate electrode layer.

The gate insulation layer may be configured to cause an electrical open circuit or to an electrical short-circuit due to a static electricity current flowing through at least one clock signal wire.

The display device may further include a capacitor including a first electrode that is electrically coupled to the impurity-doped area of the semiconductor layer, the capacitor being configured to accumulate an inflow static electricity current when the gate insulation layer is short-circuited.

DETAILED DESCRIPTION

Figure 1:
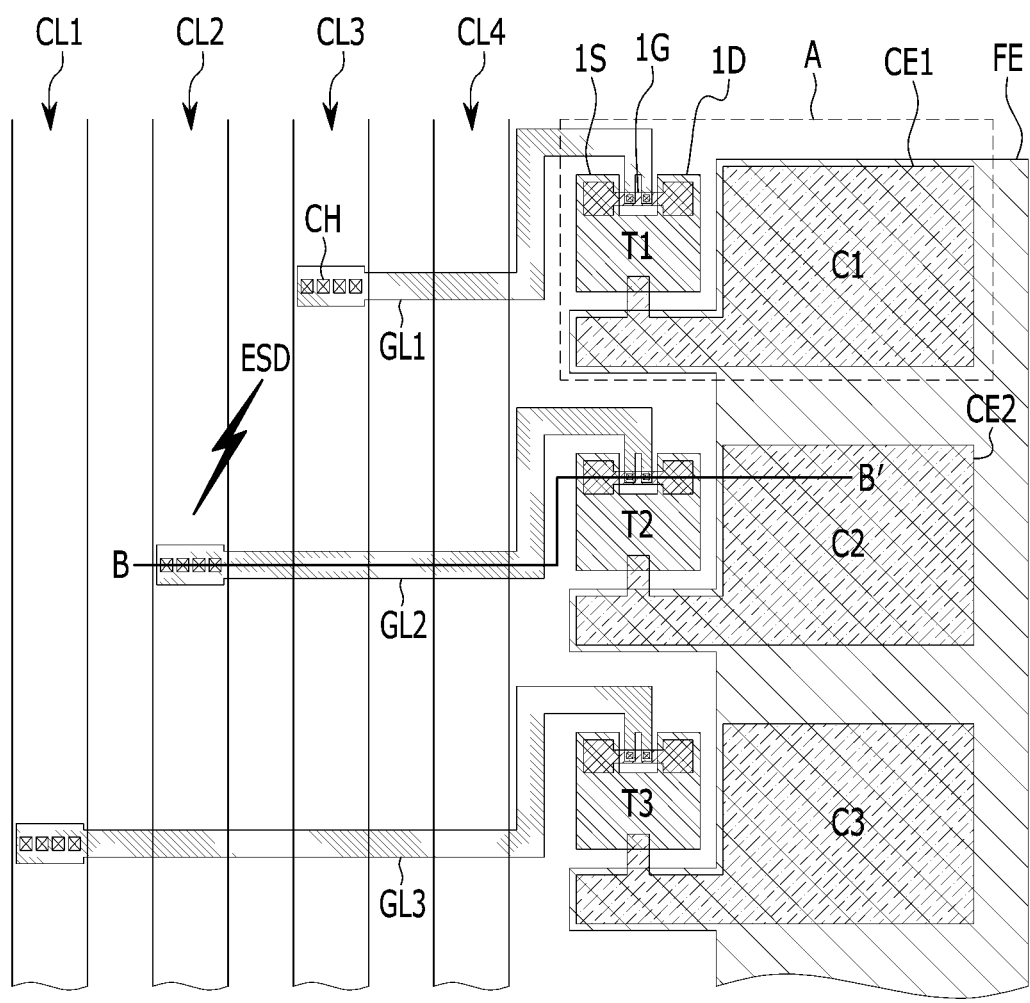
FIG. 1 is a schematic diagram showing a static electricity prevention circuit of a display panel, according to an example embodiment of the present invention.

Hereinafter, embodiments of the present invention will be described more fully with reference to the accompanying drawings, in which example embodiments of the invention are shown. As those skilled in the art would realize, the described embodiments may be modified in various different ways, all without departing from the spirit or scope of the present invention.

The unrelated parts to the description of the example embodiments may be omitted to make the description clear. Further, like reference numerals designate like element throughout the specification.

Throughout this specification and the claims that follow, when it is described that an element is "coupled" to another element, the element may be "directly coupled" to the other element, or may be "electrically coupled" to the other element through one or more other elements. In addition, unless explicitly described to the contrary, the word "comprise," and variations such as "comprises" or "comprising," will be understood to imply the inclusion of stated elements, although not necessarily to the exclusion of any other elements.

FIG. 1 is a schematic diagram showing a static electricity prevention circuit of a display panel, according to an example embodiment of the present invention.

Referring to FIG. 1, the static electricity prevention circuit of the display panel, according to the present example embodiment of the present invention, is provided in a display device. In an example embodiment, the static electricity prevention circuit is provided in the display device that includes a display panel (or display unit) including a plurality of pixels for displaying an image and a driving circuit for driving the display panel. In further detail, the static electricity prevention circuit may be provided between the driving circuit and a plurality of clock signal wires CL1 to CL4 for transmitting a clock signal to the driving circuit. In FIG. 1, the static electricity prevention circuit may be provided in one side of the plurality of clock signals.

That is, the static electricity prevention circuit, according to the present example embodiment of the present invention, may be respectively electrically coupled (or electrically connected) to the clock signal wires to prevent, or to reduce the likelihood of, electrostatic discharge (ESD) flowing through the clock signal wires that transmit clock signals (e.g., predetermined clock signals) to the driving circuit, which transmits a gate signal or a scan signal to a pixel unit formed of a plurality of pixels that display an image, or to a data source output circuit in the display panel.

Referring to FIG. 1, the static electricity prevention circuit, according to the present example embodiment, is formed of static electricity prevention transistors and capacitors respectively coupled (or connected) to the clock signal wires CL1 to CL4.

That is, static electricity prevention circuits are electrically coupled to at least one of the plurality of clock signal wires, which transmit the plurality of clock signals, and are electrically coupled to capacitors, each of which has a first electrode electrically coupled with a source electrode and a drain electrode of the static electricity prevention transistor.

FIG. 1 illustrates that the static electricity prevention circuit, according to the present example embodiment, includes three static electricity prevention transistors T1-T3 and three capacitors C1-C3, although the present invention is not limited thereto. The static electricity prevention circuit may include a plurality of static electricity prevention transistors and a plurality of capacitors corresponding to the plurality of clock signal wires. In FIG. 1, a static electricity prevention transistor T1 of the first line includes a source electrode 1S and a drain electrode 1D, which are coupled to one another in the same line, and a gate electrode 1G formed on top of the source electrode 1S and the drain electrode 1D, with a gate insulation layer interposed between the gate electrode 1G and the source and drain electrodes 1S and 1D. The source electrode 1S and the drain electrode 1D of the static electricity prevention transistor T1 of the first line are coupled to one another at lower portions thereof, and are separated from each other in upper portions where the gate electrode 1G is layered.

In addition, the gate electrode 1G of the static electricity prevention transistor T1 is electrically coupled with the corresponding clock signal line CL3 through a gate metal wire GL1. The clock signal wire CL3 and the gate metal wire GL1 are electrically coupled through a plurality of contact holes CH, and the gate metal wire GL1 is extended in one side of the clock signal wires and is electrically coupled with the gate electrode 1G of the static electricity prevention transistor T1 through a contact hole.

In addition, the source electrode 1S and the drain electrode 1D, coupled with each other in the lower side of the static electricity prevention transistor T1, are both coupled to a first electrode CE1 of the capacitor C1 of the first line in the same layer. The capacitor C1 of the first line is formed of the first electrode CE1 coupled with both of the source electrode 1S and the drain electrode 1D of the static electricity prevention transistor T1, an insulation layer layered on the first electrode CE1, and a second electrode FE layered on the insulation layer. As shown in FIG. 1, as a single conductive layer, the second electrode FE is a second electrode to each of the capacitors C1 to C3 forming the static electricity prevention circuit. A fixed voltage (e.g., a predetermined fixed voltage) is applied through the second electrode FE, and electrodes on one side of the plurality of capacitors forming the static electricity prevention circuit are set to a voltage of the fixed voltage.

In the example embodiment of FIG. 1, a static electricity prevention transistor and a capacitor that are coupled corresponding to the clock signal are formed in each line with the above-stated structure. That is, the static electricity prevention transistor T2 and the capacitor C2 are coupled to the clock signal wire CL2, and the static electricity prevention transistor T3 and the capacitor C3 are coupled to the clock signal wire CL1.

The gate metal wires GL1 to GL3, which respectively electrically connect the clock signal wires CL1 to CL3 to the static electricity prevention circuit, are metal wires that are coupled for transmission of the clock signals to the driving circuits such as a data source output circuit, a gate driver, a scan driver, and the like. The static electricity prevention circuit, which is coupled with the metal wires GL1 to GL3 between the clock signal wires and the driving circuit, is provided to prevent static electricity from flowing through the clock signal wires in the event that a gate metal wire that does not follow an antenna rule in a panel process is included in the gate metal wires.

Here, "not following the antenna rule" means that the ratio of an area of the extended gate metal wires to an area of the gate electrodes of the transistors coupled with the gate metal wires is greater than a particular value.

Herein, the operation of the static electricity prevention circuit, according to an example embodiment of the present invention, will be described. As shown in FIG. 1, when an external static electricity flows through the clock signal wire CL2, the gate insulation layer of the static electricity prevention transistor T2 coupled to the gate metal wire GL2, which does not follow the antenna rule, is burnt, or damaged, so as to prevent the external static electricity from being transmitted to other circuit elements in the display panel. That is, static electricity prevention transistors that are not related to circuit operation of the image display in the display panel are added, and thus, when static electricity flows in through a part of the plurality of clock signal wires, a high or low static electricity current is induced to an added static electricity transistor, and the thinnest gate insulation layer among the static electricity prevention transistors is burnt to thereby protect the driving circuit of the display panel.

The present example embodiment of the present invention is not limited to FIG. 1, and at least one static electricity prevention circuit may be formed in a gate metal wire that couples the clock signal wire and the driving circuit.

To conduct (or induct) the external static electricity current to the static electricity prevention transistor, the second electrode FE of the capacitor, which is coupled with the source electrode and the drain electrode of the static electricity prevention transistor, is applied with a fixed voltage and is maintained at the fixed voltage. The first electrode of the capacitor is coupled with the source electrode and the drain electrode of the static electricity prevention transistor to prevent an electrical short-circuit between the two electrodes of the capacitor during the conducting (or induction) of the static electricity, and the second electrode FE of the capacitor is coupled to a supply source of the fixed voltage.

Here, the meaning of the burning the gate insulation layer of the static electricity transistor by inducing the static electricity current may be changed depending on the amount of high-or-low-level static electricity current, but it implies that the static electricity current affects the gate insulation layer of the static electricity prevention circuit, thereby causing an electrical open (e.g., electrical open-circuit) or an electrical short-circuit.

When the static electricity prevention transistor is electrically opened, flow of electricity is ceased (or disconnected) so that external static electricity does not influence the operation of the circuit elements in the display panel. In addition, when the static electricity prevention transistor is electricity short-circuited, an excessive amount of current flows through the static electricity prevention transistor, although the current is accumulated only in the first electrode of the capacitor, which is coupled with the source-drain electrode of the static electricity prevention transistor so that the corresponding capacitor maintains a voltage that is charged by as much as a difference between a static electricity voltage of the first electrode and the fixed voltage of the second electrode. Accordingly, the external static electricity can be prevented from flowing into the driving circuit of the display panel via the clock signal wires and the gate metal wires.

Figure 2:
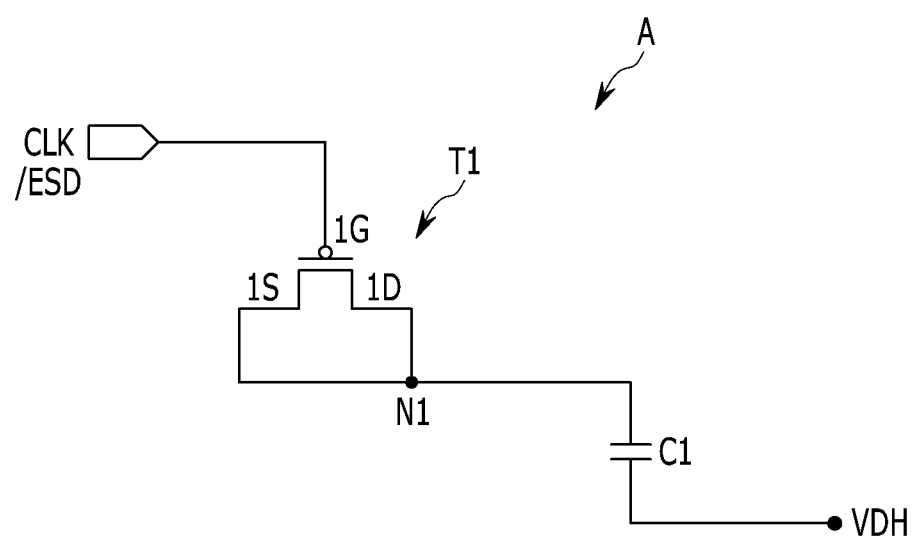
FIG. 2 is a circuit diagram of a basic unit of the static electricity prevention circuit of the embodiment shown in FIG. 1, according to an example embodiment of the present invention.

FIG. 2 is a circuit diagram illustrating a basic unit "A" of the static electricity prevention circuit of FIG. 1, according to the present example embodiment of the present invention.

At least one transistor and at least one capacitor coupled to a gate metal wire that is electrically coupled with a corresponding one of a plurality of clock signal wires comprise a basic unit in the example embodiment of the present invention, and accordingly, the static electricity prevention circuit includes a plurality of such transistors and a plurality of such capacitors.

Thus, the portion "A" is a basic unit of the static electricity prevention circuit, according to the present example embodiment of the present invention, and is a portion of the static electricity prevention circuit coupled to one of the plurality of clock signal wires (e.g., CL3 in FIG. 1). For example, the portion "A" includes a static electricity prevention transistor T1 and a capacitor C1 of the first line that is coupled with a gate metal wire GL1, which is coupled with the clock signal wire CL3 in FIG. 3.

The static electricity prevention transistor T1 includes a gate electrode 1G coupled with the gate metal wire GL1, which a clock signal or an external static electricity voltage is applied to, a source electrode 1S, and a drain electrode 1D. The source electrode 1S and the drain electrode 1D are commonly coupled to a first node N1.

The capacitor C1 includes a first electrode that is coupled to the first node N1, and a second electrode that is coupled to a supply source that transmits a fixed voltage VDH.

When an external static electricity current is induced to the gate electrode 1G of the static electricity prevention transistor T1, and thus to a gate insulation layer, that is, a lower layer of the gate electrode is short-circuited, the capacitor C1 accumulates an excessive static electricity current in the first electrode. In addition, the capacitor C1 is charged with a voltage corresponding to a difference between the static electricity voltage accumulated in the first electrode and the fixed voltage VDH applied to the second electrode, and is maintained with the charged voltage. Then, the static electricity can be stored in the static electricity prevention circuit so that the static electricity cannot affect other circuit elements in the display panel, thereby protecting the display device from the static electricity.

Alternatively, when external static electricity is induced to the gate electrode 1G of the static electricity prevention transistor T1, the gate insulation layer, that is, the lower layer of the gate electrode, is electrically opened and thus electrically decoupled so that the static electricity cannot affect other circuit elements of the display panel.

Figure 3:
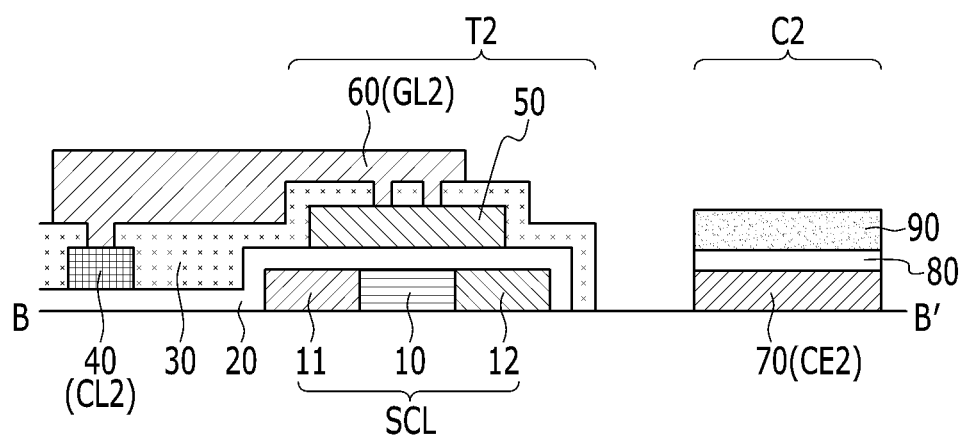
FIG. 3 is an enlarged cross-sectional view of a portion in the static electricity prevention circuit of the embodiment shown in FIG. 1, taken along the line B-B', according to the example embodiment of the present invention shown in FIG. 1.

FIG. 3 is an enlarged cross-sectional view of the static electricity prevention circuit of FIG. 1, taken along the line B-B' of FIG. 1, according to the present example embodiment of the present invention.

Although not illustrated in FIG. 3, an insulation substrate may be provided depending on each constituent means in the lowest portion (or region) of the cross-sectional structure of the portion taken along the line B-B'.

That is, an insulation substrate and a buffer layer formed of silicon oxide may be formed in the lowest portions (or regions) of the static electricity prevention transistor T2 and the capacitor C2, but because such technical content is known in the art, further description of the cross-section of the static electricity prevention circuit structure will not be provided.

In addition, the line B-B' is a line extended from the clock signal wire CL2 and then passing through the two clock signal wires CL3 and CL4, but for better comprehension and ease of description, the clock signal wires CL3 and CL4 that are not electrically coupled with the static electricity prevention transistor T2 will be omitted from FIG. 3.

Referring to FIG. 3, first, a semiconductor layer SCL of the static electricity prevention transistor T2 is formed. The semiconductor layer SCL may be formed of, for example, polysilicon (Poly-Si).

A gate insulation layer 20 is formed on the semiconductor layer SCL. A constituent material of the gate insulation layer 20 is not specifically restrictive, and may, for example, comprise: an inorganic material such as silicon oxide ($SiO_2$), silicon nitride ($SiNx$), and the like; a combination of the inorganic materials; and/or an organic material such as polyvinylpheno (PVI), polyimide, and the like. In general, the gate insulation layer 20 is the thinnest layer, so that it may be burnt in the static electricity prevention transistor due to inflow of static electricity and thus may cause an electrical open or electrical short-circuit.

After the gate insulation layer 20 is formed, a gate electrode layer 50 is formed by patterning in a portion above an area where the semiconductor layer SCL is formed.

After the gate electrode layer 50 is patterned, an impurity is doped using the gate electrode layer 50 as a doping prevention layer, and in the example embodiment of FIG. 3, a p-type impurity is doped so that p-type impurity doping areas 11 and 12 are formed. An intrinsic semiconductor layer area 10 that is not doped with an impurity remains in the semiconductor layer SCL below a portion of the gate electrode layer 50.

The p-type impurity doping areas 11 and 12 may respectively be formed as source and drain electrodes. Although it is not illustrated in FIG. 3, the p-type impurity doping areas 11 and 12 may be coupled with each other so that a common node may be formed in another location of the static electricity prevention transistor T2. In addition, a conductive layer 70 of the capacitor C2 is formed in the same layer as the common node. That is, the p-type impurity doping areas 11 and 12 are coupled with each other and the conductive layer 70 is coupled with the p-type impurity doping areas 11 and 12, and forms a first electrode CE2 of the capacitor C2.

Meanwhile, a clock signal wire 40 may be formed by patterning in an area (e.g., a predetermined area) after the gate insulation layer 20 is formed. However, the present embodiment is not limited thereto, and the clock signal wire 40 may be formed through a process that is separate from a process of forming the static electricity prevention circuit.

The clock signal wire 40 is a metal wire for transmitting a clock signal to the driving circuit from a controller. A material forming the metal wire is not restrictive, and may be a conductive material or an alloy thereof. For example, the metal wire may be formed of a metal material such as molybdenum (Mo), tantalum (Ta), cobalt (Co), and the like or an alloy thereof.

After the gate electrode layer 50 is formed, an interlayer insulation layer 30 may be formed on the gate electrode layer 50. FIG. 3 illustrates that the interlayer insulation layer 30 is formed such that it extends to an upper portion of the clock signal wire 40, but the example embodiment is not limited thereto.

A material of the interlayer insulation layer 30 is not particularly restrictive, but, like the gate insulation layer 20, the interlayer insulation layer 30 may, for example, be formed of: an inorganic material such as silicon oxide ($SiO_2$), silicon nitride ($SiNx$), and the like; a combination of the inorganic materials; or an organic material such as polyvinylphenol (PVP), polyimide, and the like. In FIG. 3, the interlayer insulation layer 30 is formed as a single layer, but may be formed of at least two layers. In addition, the interlayer insulation layer 30 may be formed of the same insulation material of the gate insulation layer, or may be formed of a different material.

After the interlayer insulation layer 30 is formed, the clock signal wire 40 and the gate electrode layer 50 are partially exposed by patterning, and then a gate metal wire 60 (e.g., GL2) is formed. The gate metal wire 60 (GL2) may be formed of a conductive metallic material, although it is not limited thereto. For example, the gate metal wire 60 may be formed of a conductive material, such as titanium (Ti), aluminum (Al), and the like, or an alloy thereof.

The gate metal wire 60 (GL2) electrically connects the clock signal wire 40, which has been patterned and exposed, and the gate electrode layer 50 through the contact holes in the interlayer insulation layer 30 that expose the clock signal wire 40 and the gate electrode layer 50.

Hence, the static electricity current flowing from the clock signal wire 40 is transmitted to the gate electrode layer 50. Then, the gate insulation layer 20, being between the gate electrode layer 50 and the semiconductor layer SCL, is burnt and thus electrically opened or short-circuited.

Meanwhile, after the conductive layer is formed as the first electrode 70 of the capacitor C2, an insulation layer 80 is layered thereon. Then, a conductive layer is formed on the insulation layer 80 as a second electrode 90 of the capacitor C2. A fixed voltage may be applied to the second electrode 90. Thus, when the gate insulation layer 20 of the static electricity prevention transistor T2 is short-circuited due to static electricity current, the static electricity current is collected in the first electrode 70 of the capacitor C2, to which the source electrode and the drain electrode, which are the impurity-doped areas 11 and 12 of the semiconductor SCL, are coupled. As a result, the static electricity current does not flow into other circuit elements of the display panel.

In the example embodiment of FIG. 3, layers that can be formed in the upper portions of the gate metal wire 60 (GL2) and the second electrode 90 of the capacitor C2 may be known layers, such as an interlayer insulation layer, a protection layer, and the like, and those layers can be formed through a manufacturing process of a display panel. As this represents common knowledge in the art, no further description will be provided.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims. Accordingly, those skilled in the art can choose and replace from the detailed description. Further, a person of ordinary skill in the art may remove a part of the constituent elements described in the specification without deterioration of performance or add constituent elements to improve performance. In addition, a person of ordinary skill in the art may change the order of the steps of the method described in the specification depending on process environment or equipment. Therefore, it is intended that the scope of the invention be defined by the claims appended hereto, and their equivalents.

DESCRIPTION OF SOME OF THE REFERENCE CHARACTERS

| | |
|---|---|
| CL1, CL2, CL3, CL4: clock signal wire | |
| GL1, GL2, GL3: gate metal wire | |
| T1, T2, T3: static electricity prevention transistor | |
| C1, C2, C3: capacitor | |
| 10: intrinsic semiconductor layer area | |
| 11, 12: p-type impurity doping area | |
| 20: gate insulation layer | 30: interlayer insulation layer |
| 40: clock signal wire | 50: gate electrode layer |
| 60: gate metal wire | 70: first electrode of capacitor |
| 80: insulation layer | 90: second electrode of capacitor |

What is claimed is:

1. A display device comprising:
a display unit comprising a plurality of pixels on a display region;
a driving circuit on a non-display region, the driving circuit being configured to drive the display unit;
a first clock signal wire configured to transmit a first clock signal to the driving circuit; and
a first circuit on the non-display region,
wherein the first circuit comprises:
a transistor electrically coupled to the first clock signal wire and comprising a source electrode, a drain electrode, and a gate electrode; and
a capacitor comprising a first electrode coupled to the source electrode and to the drain electrode of the transistor, and a second electrode,
wherein the first clock signal wire electrically coupled to a conductive wire and is on different layer from the gate electrode, and
wherein the second electrode of the capacitor is configured to receive a fixed voltage so that the second electrode is set to a voltage of the fixed voltage.

2. The display device of claim 1, wherein the transistor further comprises a semiconductor layer and a gate insulation layer between the gate electrode and the semiconductor layer, and
wherein a static electricity current flowing in through the first clock signal wire opens or short-circuits the gate insulation layer of the transistor.

3. The display device of claim 2, wherein the semiconductor layer comprises a first impurity-doped area and a second impurity-doped area electrically connected with the first impurity-doped area at an area that is not overlapped with the gate electrode.

4. The display device of claim 2, wherein when the gate insulation layer is short-circuited, the inflow static electricity current is accumulated in the first electrode of the capacitor.

5. The display device of claim 1, wherein the first electrode of the capacitor is positioned at a same layer with a semiconductor layer of the transistor.

6. The display device of claim 5, wherein the first electrode of the capacitor is coupled to an impurity-doped area of the semiconductor layer.

7. The display device of claim 1, wherein the first circuit is provided between the first clock signal wire and the driving circuit.

8. The display device of claim 1, wherein the conductive wire is coupled between the first clock signal wire and the gate electrode.

9. The display device of claim 8, wherein the conductive wire is coupled to the first clock signal wire through a first contact hole.

* * * * *